US008288840B2

(12) United States Patent
Iwaki

(10) Patent No.: US 8,288,840 B2
(45) Date of Patent: Oct. 16, 2012

(54) SEMICONDUCTOR DEVICE WITH LOWER LAYER WIRING

(75) Inventor: Takayuki Iwaki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 169 days.

(21) Appl. No.: 12/662,535

(22) Filed: Apr. 21, 2010

(65) Prior Publication Data
US 2010/0301451 A1 Dec. 2, 2010

(30) Foreign Application Priority Data

May 27, 2009 (JP) .................................. 2009-128228

(51) Int. Cl.
*H01L 21/02* (2006.01)
*H01L 27/108* (2006.01)
(52) U.S. Cl. .................. 257/532; 257/296; 257/E23.01; 257/E29.343

(58) Field of Classification Search .................. 257/532, 257/E23.01, E29.343, 296, 528
See application file for complete search history.

(56) References Cited

FOREIGN PATENT DOCUMENTS
JP 2006-228977 8/2006

*Primary Examiner* — A. Sefer
*Assistant Examiner* — Nikolay Yushin
(74) *Attorney, Agent, or Firm* — McGinn IP Law Group, PLLC

(57) ABSTRACT

A semiconductor device includes a lower layer wiring layer, an MIM capacitors and an upper layer wiring layer. The lower layer wiring layer includes a plurality of lower layer wirings. The MIM capacitor is formed above the lower layer wiring layer. The MIM capacitor includes a lower electrode, a capacity dielectric film and an upper electrode which are layered from underneath in this order. A planar form of the upper electrode is smaller than that of the lower electrode. The upper layer wiring layer includes a plurality of upper layer wirings which are connected to the lower electrode and the upper electrode through via plugs. A plane of the upper electrode is made rectangular. The lower layer wirings are not arranged right below one or more than one edge of the plane of the upper electrode.

13 Claims, 9 Drawing Sheets

EDGE OF UPPER ELECTRODE

RELATED ART

SEMICONDUCTOR DEVICE WITH LOWER LAYER WIRING

This application is based on Japanese patent application No. 2009-128228, the content of which is incorporated hereinto by reference.

BACKGROUND

1. Technical Field

The present invention relates to a semiconductor device, a lower layer wiring designing device, a method of designing lower layer wirings and a computer program.

2. Related Art

In recent years, MIM (Metal Insulator Metal) structures are applied not only to DRAMs (Dynamic Random Access Memory), but also to Decoupling Capacitors, in the field of LSI (Large Scale Integration). The MIM structure as an integrated module of LSI has become increasingly important. Thus, it has been common to mount the MIM structure in LSI.

However, the MIM capacitors may cause a failure of LSI having the MIM capacitors therein or a failure of the entire system due to an increase in leakage current resulting from the structural disruption. Therefore, desired is a technique for restraining an increase in a leakage current due to the MIM capacitors.

Such a technique is disclosed, for example, in Japanese Laid-open patent publication No. 2006-228977.

According to the technique disclosed in Japanese Laid-open patent publication No. 2006-228977, in a process of forming a copper wiring arranged underneath MIM capacitors, a trench formed in an interlayer insulating film is filled with copper to restrain an increase in a leakage current due to a Dishing phenomenon that occurs during CMP processing. More specifically, according to the technique, it is possible to restrain an increase in the leakage current due to a gap generated at the boundary between the copper wiring and the interlayer insulating layer caused by the Dishing phenomenon. Japanese Laid-open patent publication No. 2006-228977 discloses, a semiconductor device, in which an interlayer insulating film is formed on a copper diffusion prevention film formed on a layer composed of a copper wiring and an interlayer insulating film, and further the MIM capacitors are formed thereon. According to this configuration, the gap is absorbed by the interlayer insulating film, thereby realizing a decrease in the leakage current.

FIG. 9 shows a schematic cross-sectional view of a semiconductor device including MIM capacitors.

The semiconductor device shown in FIG. 9 has a lower layer wiring 110 including copper (Cu) or aluminum (Al) as a main compound underneath an MIM capacitor 200, which is composed of a lower electrode 210, a capacity dielectric film 220 and an upper electrode 230.

As shown, a hillock that is a projection having the same compound as that of the lower layer wiring 110 may be generated, from the grain boundary, in the lower layer wiring 110. The hillock may possibly be generated at the production. However, a wiring cap film 500 an interlayer insulating film 600, the lower electrode 210, the capacity dielectric film 220 and the upper electrode 230 formed on the lower layer wiring layer 100, are formed generally by sputtering or CVD. Thus, the projection form by the hillock cannot be absorbed. The projection form by the hillock is reflected to the film(s) formed above the lower layer wiring layer 100. Because the capacity dielectric film 220 is made thin, the film may be fissured as shown in the diagram due to reflection of the projection form by the hillock. This damage is affected by the process temperatures of the stress of the laminated interlayer film. The fissure of the capacity dielectric film 220 causes an increase in the leakage current.

Accordingly, the structural disruption of the MIM capacitors 20 occurs due to the hillock generated from the lower layer wiring 110, in the structure with the lower layer wiring 110 including Cu or Al as a main compound underneath the MIM capacitor 200. This results in an increase in the leakage current. Even in the structure of the semiconductor device disclosed in Japanese Laid-open patent publication No. 2006-228977, the projection form by the hillock is reflected to a film (s) such as he interlayer insulating film formed on the lower layer wiring 110. This may cause a fissure of the capacity dielectric film 220.

SUMMARY

In one embodiment, there is provided a semiconductor device comprising: a lower layer wiring layer which includes a plurality of lower layer wirings; an MIM capacitor which is formed above the lower layer wiring layer and includes a lower electrode, a capacity dielectric film and an upper electrode having a planar form smaller than that of the lower electrode which are layered from underneath in this order; and an upper layer wiring layer which is formed above the MIM capacitor and includes a plurality of upper layer wirings connected to the lower electrode and the upper electrode respectively through a via plug, and wherein a plane of the upper electrode is made rectangular, and the lower layer wirings are not arranged right below one or more than one edge of the plane of the upper electrode.

According to the semiconductor device of the present invention, the lower layer wirings formed underneath the MIM capacitor is not arranged right below the one or more than one edge of the upper electrode whose plane is made rectangular. In this case, layout flexibility of the lower wiring underneath the MIM capacitor is restricted, thus decreasing the occupancy of the lower layer wirings underneath the MIM capacitor.

As a result, it is possible to decrease the possibility of the structural disruption of the MIM capacitor due to the hillock generation in the lower layer wiring, thus decreasing the possibility of the leakage current, as compared to the general semiconductor device. In the general semiconductor device, a plurality of lower layer wirings are spread with spacing in accordance with the designing standard, underneath the MIM capacitor. There is formed a large enough area for not arranging the lower layer wirings. Thus, it is possible to maintain the sufficient process stability or high integration of the lower wirings.

In another embodiment, a, there is provided a method of designing lower layer wirings for designing the semiconductor device, the method comprising: determining an arrangement position of the MIM capacitor; specifying, as a lower layer wiring arrangement forbidden area, an area right below one or more than one edge of the plane of the upper electrode of the MIM capacitor whose arrangement position has been determined, areas right below one pair of two facing edges of the plane, an area within a predetermined distance from right below one or more than one edge of the plane, or areas within a predetermined distance from right below one pair of two facing edges of the plane; and designing a pattern of the lower layer wirings so that the lower layer wirings are not arranged in the lower layer wiring arrangement forbidden area.

In another embodiment, there is provided a method of designing lower layer wirings for designing the semiconductor device, the method comprising: designing a pattern of the lower layer wirings; determining an arrangement position of the MIM capacitors based on the pattern designed in the designing; and compensating for the pattern in accordance with a predetermined compensation rule so that the lower layer wirings do not exist in an area right below one or more than one edge of the plane of the upper electrode of the MIM capacitor, areas of one pair of two facing edges of the plane, an area within a predetermined distance right below one or more than one edge of the plane, or areas within a predetermined distance right below one pair of two facing edges of the plane.

In another embodiment, there is provided a lower layer wiring designing device for designing the semiconductor device, the device comprising: an MIM arrangement position determination unit which determines an arrangement position of the MIM capacitor; a lower layer wiring arrangement forbidden area information acquisition unit which acquires lower layer wiring arrangement forbidden area information indicating an area right below one or more than one edge of the plane of the upper electrode of the MIM capacitor, areas right below one pair of two facing edges of the plane, an area within a predetermined distance from right below one or more than one edge of the plane, or areas within a predetermined distance from right below one pair of two facing edges of the plane; a lower layer wiring arrangement forbidden area information retention unit which retains the lower layer wiring arrangement forbidden area information; a forbidden area consideration designing unit which designs a pattern of the lower layer wirings so that the lower layer wirings are not arranged in the area specified with the lower layer wiring arrangement forbidden area information; and an output unit which outputs the designed pattern of the lower layer wirings.

In another embodiment, there is provided a lower layer wiring designing device for designing the semiconductor device, the device comprising: a lower layer wiring designing unit which designs a pattern of the lower layer wirings; a lower layer wiring consideration MIM arrangement position determination unit which determines an arrangement position of the MIM capacitor in consideration of the pattern designed by the lower layer wiring designing unit; a lower layer wiring arrangement forbidden area information acquisition unit which acquires lower layer wiring arrangement forbidden area information indicating an area right below one or more than one edge of the plane of the upper electrode of the MIM capacitor, area right below one pair of two facing edges of the plane, an area within a predetermined distance from right below one or more than one edge of the plane, or areas within a predetermined distance from right below one pair of two facing edges of the plane; a lower layer wiring arrangement forbidden area information retention unit which retains the lower layer wiring arrangement forbidden area information; a compensation rule retention unit which retains a compensation rule for compensating for the pattern of the lower layer wirings that has been designed by the lower layer wiring designing unit; a compensation unit which compensates for the pattern of the lower layer wirings that has been designed by the lower layer wiring designing unit using the lower layer wiring arrangement forbidden area information and the compensation rule; and an output unit which outputs the compensated pattern of the lower layer wirings.

According to the method of designing lower layer wirings and the lower layer wiring designing device of the present invention, it is possible to design the lower layer wirings after determining the arrangement position of the MIM capacitor, and it is also possible to determine the arrangement position of the MIM capacitor after designing the lower layer wirings.

As a result, it is possible to adequately design the lower layer wirings based on the required performance of the semiconductor device.

According to the semiconductor device, the lower layer wiring designing device, the method of designing lower layer wirings and the computer program of the present invention, it is possible to decrease the possibility of the structural disruption of the MIM capacitor. As a result, it is possible to restrain an increase of the leakage current.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
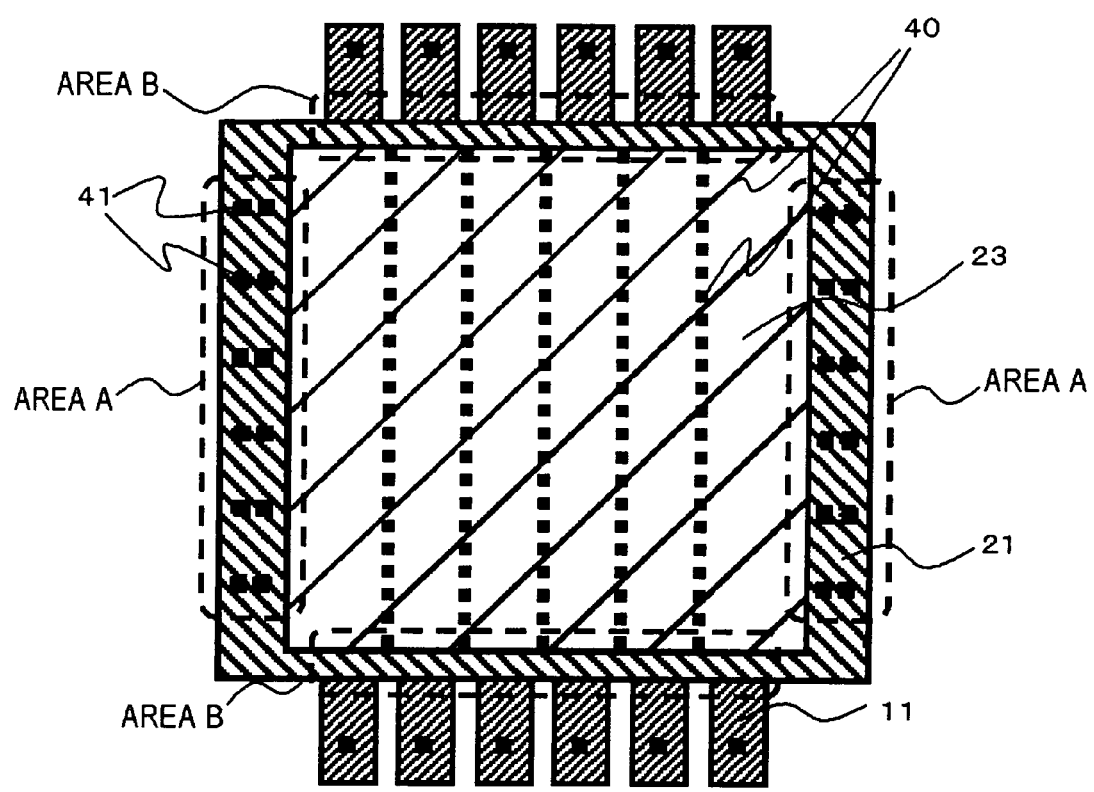
FIG. 1 is a plane schematic diagram showing the relationship between an upper electrode, a lower electrode and lower layer wirings.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Detailed description of the present invention will now be made with reference to the accompanying drawings. In the entire drawings, the same constituent elements are denoted with the same reference numerals, and thus will not be described repeatedly.

Each constituent of the lower layer wiring designing device is realized by an arbitrary combination of hardware and software. Examples of the hardware and software are, a CPU, a memory, a program loaded in the memory, a storage unit (such as a hard disk which stores the program), and an interface for network connection in an arbitrary computer. The program loaded in the memory may be a program preliminarily stored in the memory at the time of shipment of the device and a program downloaded from a storage medium such as a CD or form a server on the Internet. Those skilled in the art understand that many modifications of the implementation method and the device are possible.

Functional block diagrams referred for the description of this embodiment show blocks of functional unit, rather than hardware configuration unit. In these diagrams, the device of this embodiment is realized by one single device. However, the implementation of the device is not limited to this. In other words, the device may be realized with physically separated components or logically separated components.

<Configuration>

Figure 2:
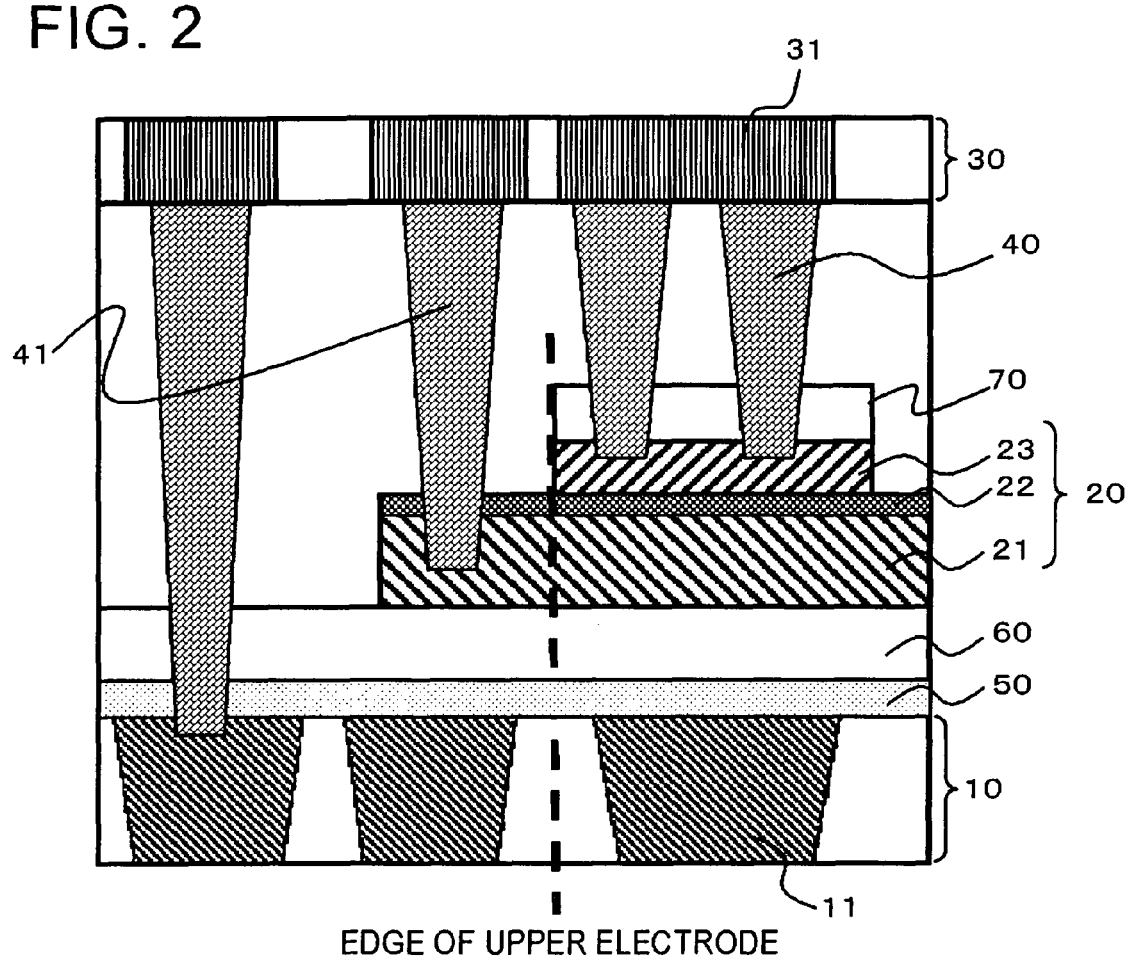
FIG. 2 is a schematic cross-sectional view of a semiconductor device of this embodiment.

FIG. 2 shows a schematic cross-sectional view of the semiconductor device of this embodiment. FIG. 1 shows a plan view showing relationships among an upper electrode 23, a lower electrode 21 and lower layer wirings 11 of the semiconductor device of this embodiment. FIG. 1 is the plan view showing the upper electrode 23, the lower electrode 21 and the lower layer wirings 11, viewed downwardly from top in FIG. 2.

As shown in FIG. 2, the semiconductor device of this embodiment has a lower layer wiring 10, MIM capacitors 20 (composed of the lower electrode 21, a capacity dielectric film 22 and the upper electrode 23), an upper layer wiring layer 30, and via plugs 40 and 41. In addition, the device may have a wiring cap film 50, an interlayer insulating film 60 and a hard mask insulating film 70.

The lower layer wiring layer 10 includes a plurality of lower layer wirings 11. Each of the lower layer wirings 11 includes Cu or Al as a main compound.

The MIM capacitor 20 have a configuration in which the lower electrode 21, the capacity dielectric film 22 and the upper electrode 23 are layered from underneath in this order. The MIM capacitor 20 is formed above the lower layer wiring layer 10.

The lower electrode 21 is made of at least one of metal such as Ti (titanium) and Ta (tantalum), and a conductive metal nitride such as TiN (titanium nitride) and TaN (tantalum nitride). The planar form of the lower electrode 21 is not especially limited, but may possibly be a rectangular form as shown in FIG. 1.

The capacity dielectric film 22 is made of at least one of SiN (silicon nitride), $Ta_2O_5$ (tantalum oxide), $ZrO_2$ (zirconium oxide), $TiO_2$ (titanium oxide), $HfO_2$ (Hafnium oxide) and so on. In addition, a high dielectric film with a Perovskite structure may be applied as the capacity dielectric film 22.

The upper electrode 23 is made of at least one of metal such as Ti and Ta, and a conductive metal nitride such as TiN and TaN. The planar form of the upper electrode 23 is rectangular as shown in FIG. 1, and is smaller than the planar form of the lower electrode 21.

The upper layer wiring layer 30 is formed above the MIM capacitors 20, and includes a plurality of upper layer wirings 31, which are connected to the lower electrode 21 and the upper electrode 23 through the via plugs 41 and 40. The upper layer wirings 31 and the via plugs 40 and 41 include Cu or Al as a main compound. The upper layer wirings 31 and the via plugs 40 and 41 may include the same compound as a main compound.

The wiring cap film 50 may be made of at least one of SiC (silicon carbide) and SiCN (silicon carbonitride), for example. The interlayer insulating film 60 may be made of $SiO_2$ (silicon dioxide), for example. The hard mask insulating film 70 may be made of at least one of SiN, SiCN, SiON (silicon oxynitride) and the like. The composition of the hard mask insulating film 70 has to be different from a wiring interlayer film which is composed of $SiO_2$ or SiOC (silicon oxycarbide).

In this embodiment, the relationship between the lower layer wirings 11 and the MIM capacitor 20 will now be described with reference to FIG. 1 and FIG. 2.

In this embodiment, the plurality of lower layer wirings 11 are spread underneath the MIM capacitor 20 without unnecessary space with spacing in accordance with the designing standard from a point of view of the process stability and high integration of the lower layer wirings 11. At this time, the lower layer wirings 11 are spread in a manner that they are not formed right below one or more than one edge of the upper electrode 23. For example, the lower layer wirings 11 are spread so that they are not formed right below one pair of two facing edges of the upper electrode 23. Accordingly, the edge, right below which the lower layer wiring 11 are not formed, is not subject to a hillock of the lower layer wirings 11.

The arrangement of the lower layer wirings 11 satisfying the above-described condition corresponds to the pattern in which the plurality of linear lower layer wirings 11 are aligned at equal intervals, as shown in FIG. 1. FIG. 1 shows the pattern the lower layer wirings 11 are not arranged right below the one pair of two facing edges of the upper electrode 23 on the left and right sides of the upper electrode 23 in FIG. 1.

In the case of a semiconductor device satisfying such a relationship between the lower layer wirings 11 and the MIM capacitors 20, a lower layer wiring arrangement forbidden area (right below the edge of the upper electrode 23) for not arranging the lower layer wirings 11 is partially formed below the MIM capacitor 20. Thus, the occupancy of the lower layer wirings 11 below the MIM capacitor 20 is lower than that of the case where the plurality of lower layer wirings 11 are spread with spacing in accordance with a designing standard without unnecessary space from a point of view of the process stability and high integration of the lower layer wirings 11 as the top priority. As a result, the structural disruption of the MIM capacitor 20 due to the hillock in the lower layer wirings 11 can be restrained, and thus restraining occurrence of leakage current. The lower layer wiring arrangement forbidden area (right below the edge of the upper electrode 23) for not arranging the lower layer wirings 11 is minimized, thus enabling to maintain the sufficient process stability and high integration of the lower wirings 11.

It can be applied as another method of partially forming the lower layer wiring arrangement forbidden area for not arranging the lower wirings 11 to select an area other than an area right below the edge of the upper electrode 23. However, like this embodiment, the lower layer wirings 11 are not arranged right below the edge of the upper electrode 23. As a result, as will be described below, it is possible to realize a structure that leakage current from the MIM capacitor 20 can be restrained.

To avoid the structural disruption of the MIM capacitors 20 due to the hillock generation in the lower layer wirings 11, it may be considered that the lower layer wirings 11 are not at all arranged below the MIM capacitors 20. However, in the case of a highly integrated LSI, it is difficult to put a restriction of not arranging the lower layer wirings 11 below the MIM capacitors 20.

Even in the above-described structure, it is not possible to avoid the structural disruption of the MIM capacitor 20 due to the hillock of the lower layer wirings 11. The semiconductor device of this embodiment may have a structure that can relatively reduce leakage current generated at the occurrence of the structural disruption in the MIM capacitors 20. This structure will now specifically be described.

Figure 3:
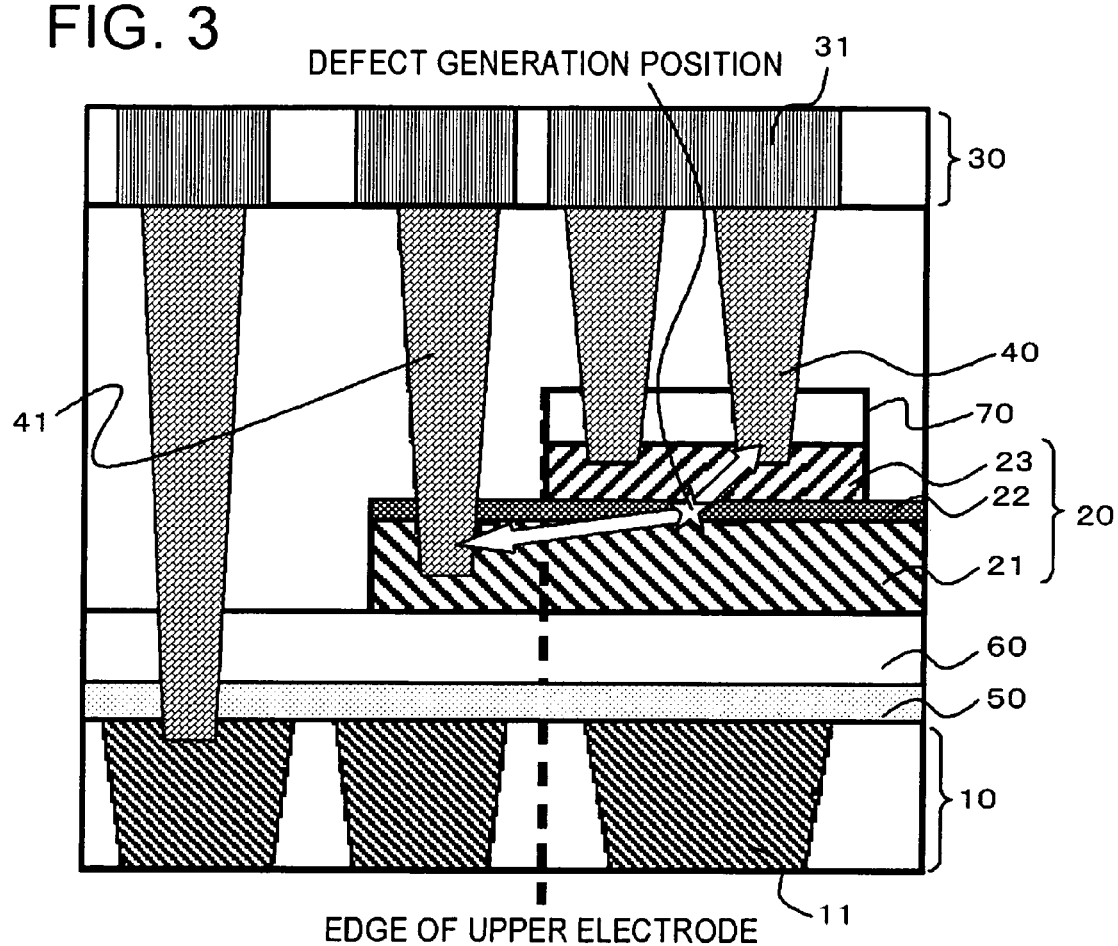
FIG. 3 is a schematic cross-sectional view of the semiconductor device of this embodiment.

If the capacity dielectric film 22 is damaged, leakage current leaking from the MIM capacitors 20 occurs, as shown in FIG. 3, through the via plug 40 connecting the upper electrode 23 and the upper layer wirings 31, a defect generation position of the capacity dielectric film 22, and the via plug 41 connecting the lower electrode 21 and the lower layer wirings 31.

To reduce the leakage current leaking from the MIM capacitors 20 as much as possible, there is considered one structure for increasing the resistance of the MIM capacitors 20 to the leakage current. Specifically, according to this structure, the distance at which the leakage current flows inside the MIM capacitors 20 is increased as much as possible. That is, the "distance between the contact point of the upper electrode 23 and the via plug 40, and the defect generation position of the capacity dielectric film 22" plus the "distance between the contact point of the lower electrode 21 and the via plug 41, and the defect generation position of the capacity dielectric film 22" are increased as much as possible. By so doing, it is possible to increase the resistance of the MIM capacitor 20 to the leakage current as much as possible.

In general, the via plugs 40 connecting the upper layer wiring 31 and the upper electrode 23 are arranged as many as possible, for the purpose of decreasing the resistance of the electrode as much as possible, in consideration of the performance of the MIM capacitor 20. Specifically, they are arranged on the whole surface of the approximate plane on the upper electrode 23 with spacing in accordance with the designing standard. In the structure as shown in FIG. 1, the plurality of via plugs 41 connecting the upper layer wirings 31 and the lower electrode 21 may be arranged with spacing in accordance with the designing standard on the approximate whole surface of areas (area A and B) visible from the side of the upper layer wirings 31 where the lower electrode 21 and the upper electrode 23 having a smaller planar form than the lower electrode 21 are layered vertically.

Figure 8:
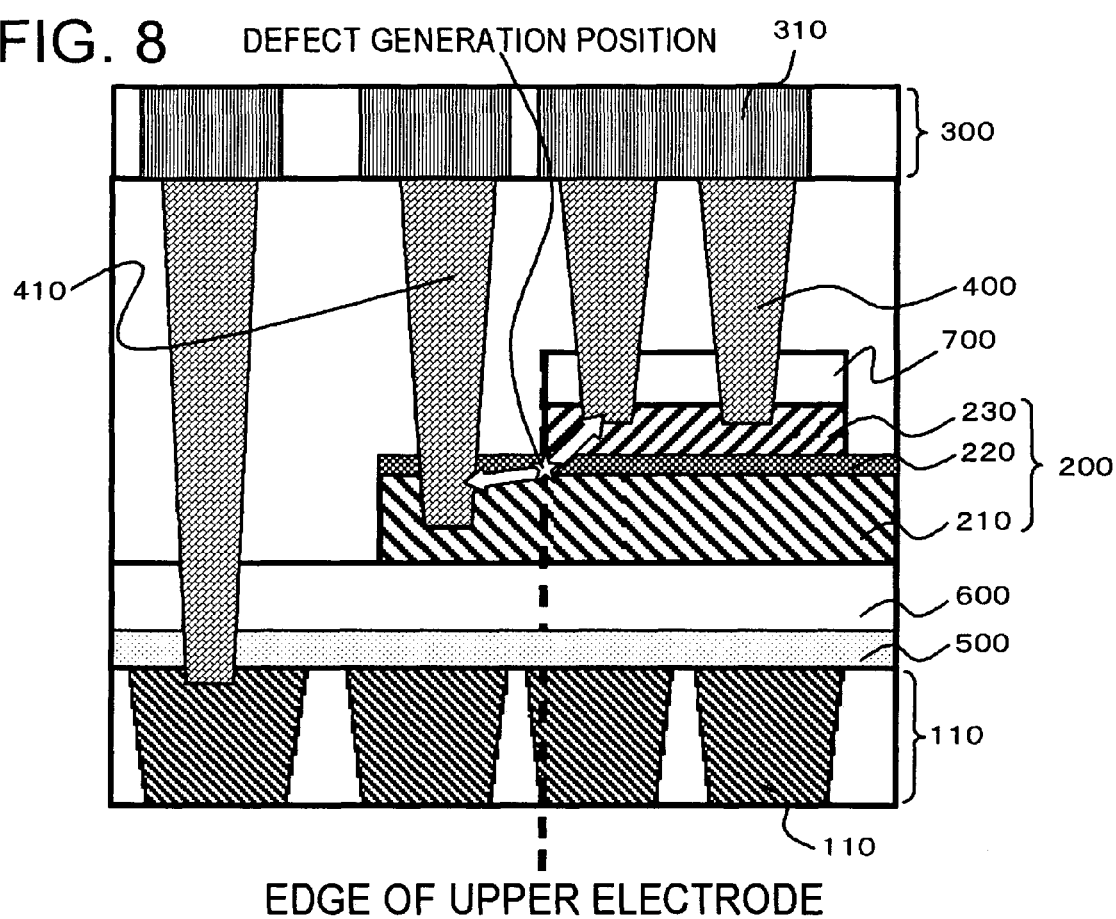
FIG. 8 is a schematic cross-sectional view of a semiconductor device having lower layer wirings below MIM capacitors.
Figure 9:
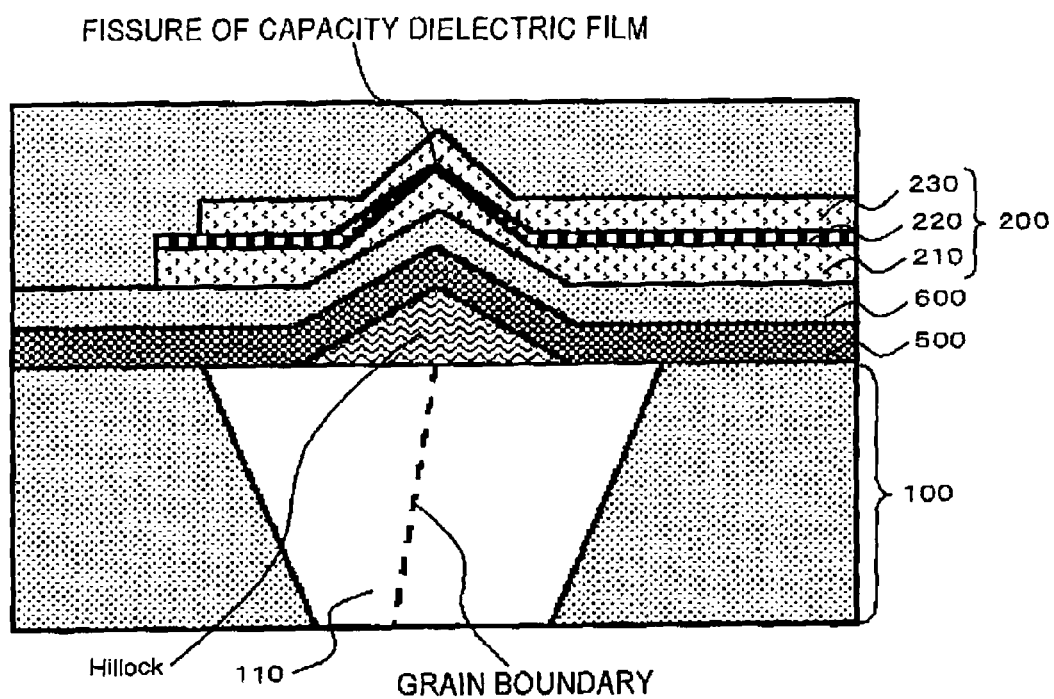
FIG. 9 is a schematic cross-sectional view of a semiconductor device having the lower layer wirings below the MIM capacitors.

In this structure, if a defect occurs in the capacity dielectric film 220 right below the edge of the upper electrode 230 as shown in FIG. 8, the "distance between a contact point of the upper electrode 230 and the via plug 400, and a defect generation position of the capacity dielectric film 220" plus the "distance between a contact point of the lower electrode 210 and the via plug 410, and a defect generation position of the capacity dielectric film 220" becomes minimum. In other words, the resistance of the MIM capacitor 200 to the leakage current becomes minimum, while the leakage current from the MIM capacitor 200 becomes maximum.

In this embodiment, as described above, to avoid the situation in which the leakage current becomes maximum, the via plugs 41 connecting the upper layer wirings 31 and the lower electrode 21 may be arranged near the edge of the upper electrode 23, right below which no lower layer wirings are arranged.

That is, in the case where the via plugs 41 are not arranged right below one pair of two facing edges of the upper electrode 23 (the two edges are positioned on the left and right sides of the upper electrodes 23) as shown in FIG. 1, the lower layer wirings 11 may be arranged only near the edges of the upper electrode 23 right below which the lower layer wirings 11 are not arranged (in other words, arranged only in the area A as an area within a predetermined distance from the above-described two edges) instead of being arranged in the entire possible area (areas A and B) on which the via plugs can be arranged.

As described above, the defect of the capacity dielectric film 22 due to the hillock of the lower layer wirings 11 occurs in the lower layer wirings 11. In the structure of FIG. 1, the lower layer wirings 11 are not arranged right below the edges of the upper electrode 23 near the areas A where the via plugs 41 are arranged. Thus, there is little probability that the defect occurs in the capacity dielectric film 22 right below the edges. Therefore, it is possible to increase the "distance between the contact point of the lower electrode 21 and the via plug 41, and the defect generation position of the capacity dielectric film 22" to some extent, as shown in FIG. 3. As a result, a decrease in the leakage current can be realized.

The present inventors confirm that the hillock of the lower layer wirings 11 has a width of 200 nm on its bottom according to a LSI semiconductor device popularly used in recent years. When this hillock grows evenly in all directions, the bottom of the hillock has a spread of 100 nm radius about right below point of the top of the hillock.

Figure 4:
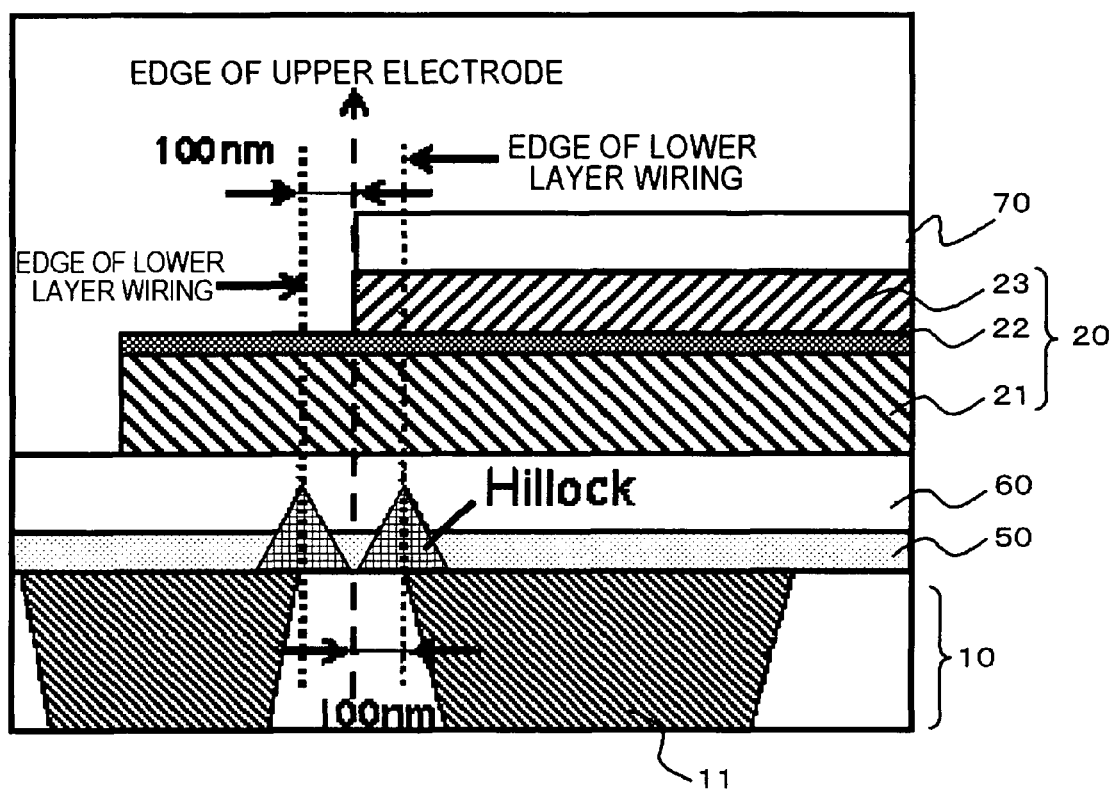
FIG. 4 is a schematic cross-sectional view of the semiconductor device of this embodiment.
Figure 5:
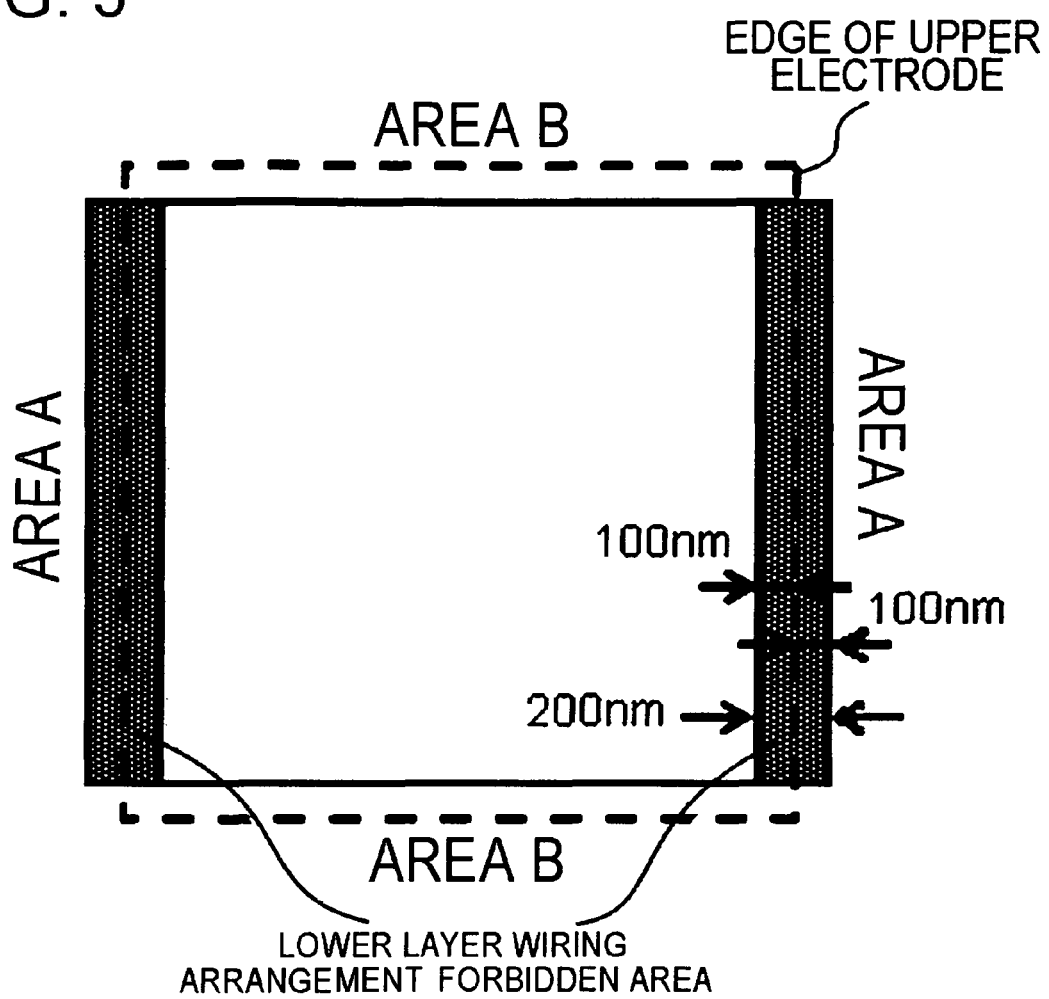
FIG. 5 is a schematic cross-sectional view for explaining a lower layer wiring arrangement forbidden area.

In the structure of this embodiment, as shown in FIG. 4 and FIG. 5, the lower layer wiring arrangement forbidden area may be an area within 100 nm distance from right below one or more than one edge of the plane of the upper electrode 23 or an area right below one pair of two facing edges of the plane of the upper electrode 23, and no lower layer wirings 11 are arranged in the area. The via plugs 41 connecting the upper layer wirings 31 and the lower electrode 21 may be arranged near the above-described edge(s).

In this structure, the capacity dielectric film 22 right below the edge is hardly subject to the hillock of the lower layer wirings 11. Thus, there is very little probability that the defect occurs in the capacity dielectric film 22 right below the edge. Therefore, it is possible to increase the "distance between the contact point of the lower electrode 21 and the via plug 41, and the defect generation position of the capacity dielectric film 22" to some extent, as shown in FIG. 3. As a result, a decrease in the leakage current can be realized.

In the structure of this embodiment, as shown in FIG. 1, the lower layer wirings 11 may not be arranged right below the via plug 40 connecting the upper layer wiring 31 (not shown in FIG. 1) and the upper electrode 23. In this structure, it is possible to increase the "distance between the contact point of the upper electrode 23 and the via plugs 40, and the defect generation position of the capacity dielectric film 22" to some extent, and then a decrease in the leakage current can be realized.

Descriptions will now be made to examples of a lower layer wiring designing device, a method of designing a lower layer wirings, and program, all for designing the pattern of the above-described lower layer wirings 11.

EXAMPLE 1

Figure 6:
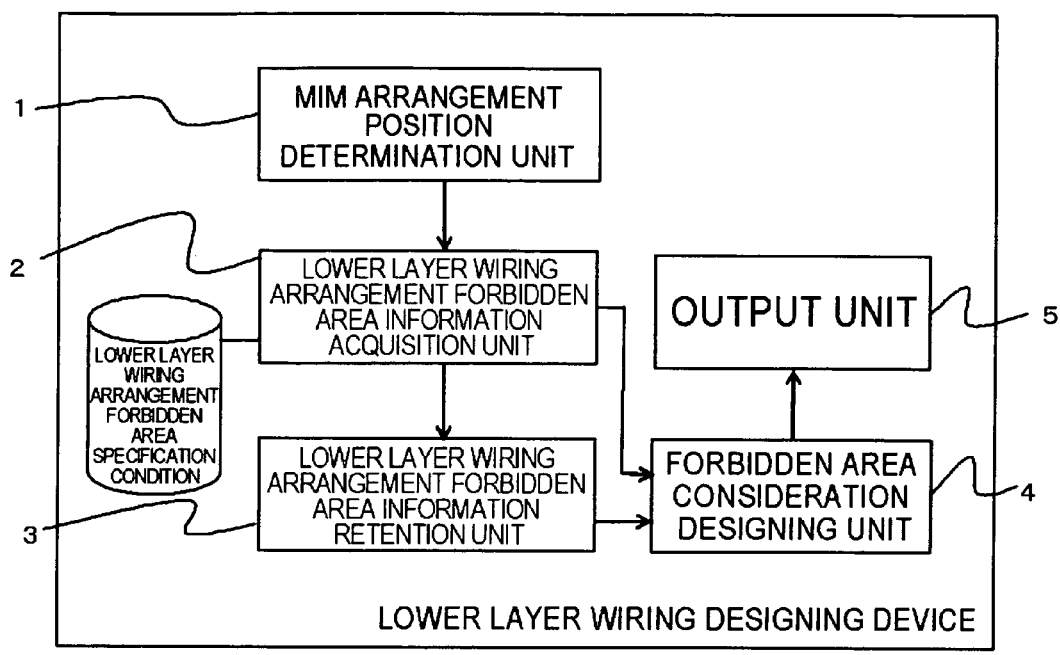
FIG. 6 is a functional block diagram of a lower layer wiring designing device of this embodiment.

As shown in a functional block diagram of FIG. 6, an example of the lower layer wiring designing device of this embodiment includes an MIM arrangement position determination unit 1, a lower layer wiring arrangement forbidden area information acquisition unit 2, a lower layer wiring arrangement forbidden area information retention unit 3, a forbidden area consideration designing unit 4 and an output unit 5. The lower layer wiring designing device of this embodiment may store a lower layer wiring arrangement forbidden area specification condition in its internal memory. The lower layer wiring arrangement forbidden area specification condition may be stored in a memory of an external unit. The lower layer wiring arrangement forbidden area information acquisition unit 2 acquires the lower layer wiring arrangement forbidden area specification condition so as to use this condition.

The MIM arrangement position determination unit 1 is configured so as to determine the arrangement position of the MIM capacitors 20.

For example, the MIM arrangement position determination unit 1 can display arrangement area(s) for arranging the MIM capacitors 20 on its display. The unit 1 uses the displayed area as an interface for receiving an input regarding the arrangement position of the MIN capacitors 20. Then, the unit 1 receives a determination input regarding the arrangement position of the MIM capacitors 20 from a user through an operational device (for example: arrow keys, a mouse, a keyboard, a touchscreen, and the like).

The MIM arrangement position determination unit 1 may be structured to determine the arrangement position of the MIM capacitors 20. Specifically, upon reception of an input regarding the size and number of MIM capacitors 20 to be arranged from the user through the operational device (for example: arrow keys, a mouse, a keyboard, a touchscreen, and the like), the unit 1 may determine the arrangement position, by regularly arranging the received size and number of MIM capacitors 20, in accordance with a predetermined rule.

The lower layer wiring arrangement forbidden area information acquisition unit 2 acquires lower layer forbidden area information. This information represents an area right below one or more than one edge of the plane of the upper electrode 23 of the MIM capacitors 20, areas right below one pair of two facing edges, an area within a predetermined distance (100 nm) right below the one or more than one edge, or areas within a predetermined distance (for example: 100 nm) right below the one pair of two facing edges.

For example, the lower layer wiring arrangement forbidden area information acquisition unit 2 displays a possible area(s) for arranging the MIM capacitors 20 on the display. The unit 2 receives an input regarding the edge(s) (input represents the position and length of the edge, or the selection of the edge thorough the displayed MIM capacitors 20 whose arrangement positions have been determined) from the user. Based on the input regarding the edge, the unit 2 specifies an area right below the edge or an area within a predetermined distance (for example: 100 nm) from right below the edge, in accordance with the preliminarily retained condition (lower layer wiring arrangement forbidden area specification condition). The unit 2 generates and acquires lower layer wiring arrangement forbidden area information representing the specified area.

The lower layer wiring arrangement forbidden area information retention unit 3 retains the lower layer wiring arrangement forbidden area information acquired by the lower layer wiring arrangement forbidden area information acquisition unit 2. The lower layer wiring arrangement forbidden area information retention unit 3 may include a volatile memory or non-volatile memory.

The forbidden area consideration designing unit 4 designs the pattern of the lower layer wirings 11 not to arrange the lower layer wirings 11 in an area specified with the lower layer wiring arrangement forbidden area information. The forbidden area consideration designing unit 4 can be realized with a conventional wiring designing tool that includes a lower layer acquiring unit, a generation unit and a designing unit. The acquiring unit acquires the lower layer wiring arrangement forbidden area information from the lower layer wiring arrangement forbidden area information acquisition unit 2 or the lower layer forbidden area information retention unit 3. The generation unit generates a rule for not arranging the lower layer wirings in an area specified with the acquired lower layer wiring arrangement forbidden area information. The designing unit designs the lower layer wirings in accordance with the generated rule.

The output unit 5 is configured to output the pattern designed by the forbidden area consideration designing unit 4. This output includes a variety of outputs, such as an output to the display, an output to paper documents, and an output of data to another unit wirelessly or by wire.

Descriptions will now be made to a method of designing lower layer wirings, using the above-described lower layer wiring designing device.

The method of designing lower layer wirings according to this embodiment includes a first step S1, a second step S2 and a third step S3.

In the first step S1, the arrangement position of the MIM capacitors 20 is determined. This step is performed before a step (third step) for designing the pattern of the lower layer wirings 11. That is, the arrangement position of the MIM capacitors 20 is not subject to the lower wirings 11. This step may be, for example, to display an area(s) for arranging the MIM capacitors 20 on the display attached to the lower layer wiring device, and to receive a determination input regarding the position for arranging the MIM capacitors 20 using the operational device (for example: arrow keys, a mouse, a keyboard, a touchscreen, and the like) attached to the lower layer wiring designing device.

The second step S2 is to specify a lower layer wiring arrangement forbidden area(s). Specifically, this area (these areas) may be an area right below the one or more than one edge of the plane of the upper electrode 23 of the MIM capacitors 20, areas right below one pair of two facing edges, an area within a predetermined distance (for example: 100 nm) from right below the edge, or areas within a predetermined distance (for example: 100 nm) right below the one pair of two facing edges. This step may be, for example, to receive a selection input regarding the above-described edge from the user, using the MIM capacitors 20 whose arrangement position has been determined and displayed on the display. In addition, this step may be to specify, as the lower layer wiring arrangement forbidden area, an area right below the edge indicated by the selection input or an area within a predetermined distance (for example: 100 nm) from right below the said edge. In this case, the area is specified in accordance with a preliminarily retained condition (lower layer wiring arrangement forbidden area specification condition) for specifying the lower layer wiring arrangement forbidden area.

In the third step S3, the pattern of the lower layer wirings 11 is designed so that the lower layer wirings 11 are not arranged in the lower layer wiring arrangement forbidden area. This step may be realized using a conventional wiring designing tool.

The above-described method of designing lower layer wirings may be realized by a program for executing the first step, the second step and the third step on a computer. The first step is to determine the arrangement position of the MIM capacitors. The second step is to specify, as the lower layer wiring arrangement forbidden area, the area right below the edge of the plane of the upper electrode of the MIM capacitors whose arrangement position has been determined, the area(s) right below the one pair of two facing edges, the area within a predetermined distance from right below the edge, the areas within predetermined distance from right below the one pair of two facing edges. The third step is to set the pattern of the lower layer wirings so that the lower layer wirings are not arranged in the lower layer wiring arrangement forbidden area. The above-described program may be a program that continuously executes all of the above-described steps, or a program that is realized in combination with a plurality of programs corresponding to a plurality of process units into which the above-described steps have been divided.

The above-described lower layer wiring designing device, and method of designing lower layer wirings and program are all effective, when the capacity of the MIM capacitors 20 to be implemented is determined, for example, when the size and number of the MIM capacitors 20 to be implemented on an LSI are fixed for a given design.

EXAMPLE 2

Figure 7:
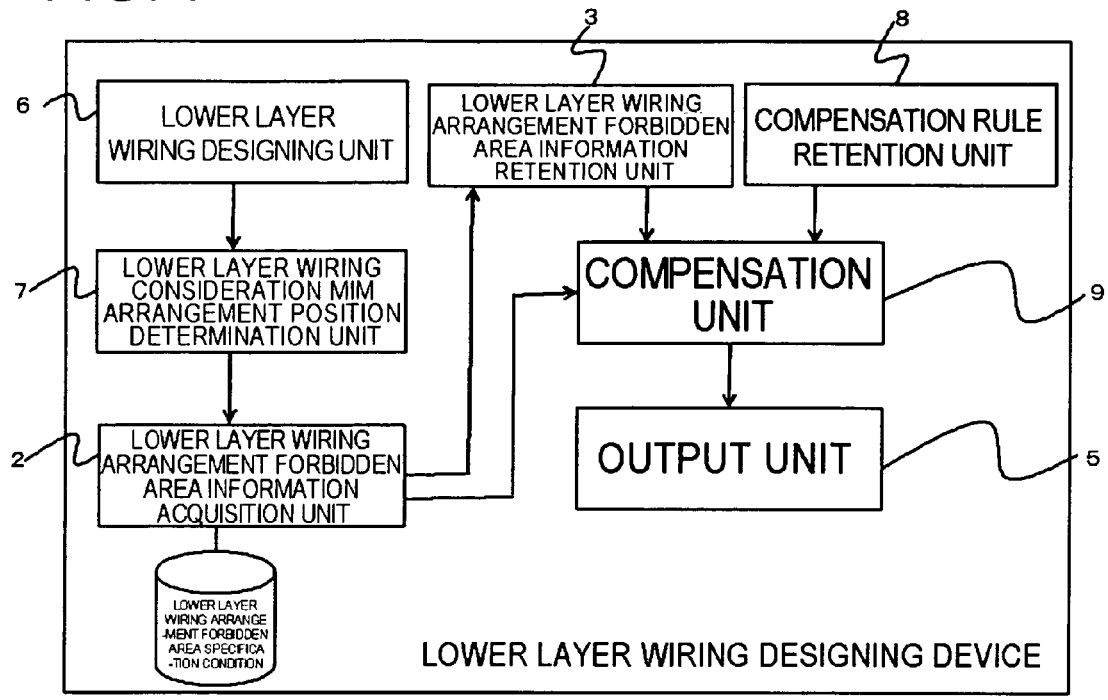
FIG. 7 is a functional block diagram of the lower layer wiring designing device of this embodiment.

As shown in a functional block diagram of FIG. 7, another example of a lower layer wiring designing device of this embodiment includes a lower layer wiring designing unit 6, a lower layer wiring consideration MIM arrangement position determination unit 7, the lower layer wiring arrangement forbidden area information acquisition unit 2, the lower layer wiring arrangement forbidden area information retention unit 3, a compensation rule retention unit 8, a compensation unit 9 and the output unit 5. The device may store the lower layer wiring arrangement forbidden area specification condition in its internal memory. The lower layer wiring arrangement forbidden area information acquisition unit 2 may be configured to use the lower layer wiring arrangement forbidden area specification condition. The lower layer wiring arrangement forbidden area specification condition may be stored in an external memory.

The lower layer wiring designing unit 6 designs the pattern of the lower layer wirings 11. The lower layer wiring designing unit 6 is realized with a conventional wiring designing tool. The lower layer wiring designing unit 6 differs from the above-described forbidden area consideration designing unit, from a point that the unit 6 designs the pattern of the lower wirings 11 without consideration of the lower layer wiring arrangement forbidden area.

The lower layer wiring consideration MIM arrangement position determination unit 7 is configured to determine the arrangement position of the MIM capacitors 20 in consideration of the pattern designed by the lower layer wiring designing unit 6.

Specifically, for example, the lower layer wiring consideration MIM arrangement position determination unit 7 may receive an input regarding the arrangement position of the MIM capacitors 20 determined by a user with referring to the pattern designed by the lower layer wiring designing unit 6.

Alternatively the lower layer wiring consideration MIM arrangement position determination unit 7 may preliminarily receive an input regarding the form and size of the MIM capacitor 20 to store the input in an internal memory, and then automatically specify the arrangement position of one or more than one MIM capacitor 20 in consideration of the pattern designed by the lower layer wiring designing unit 6. Upon reception of a user selection input among the specified one or more than one arrangement position, the lower layer wiring consideration MIM arrangement position determination unit 7 may determine the arrangement position. In this case, the lower layer wiring consideration MIM arrangement position determination unit 7 may preliminarily store a rule for specifying the arrangement position of the MIM capacitors 20, and specify the arrangement position in accordance with this rule.

The rule for determining the arrangement position may be a rule for specifying all arrangement positions for the MIM capacitors 20 in a manner that the lower layer wirings 11 are not positioned in an area right below one or more than one edge of the plane of the upper electrode 23 of the MIM capacitors 20, areas right below one pair of two facing edges, an area within a predetermined distance (for example: 100 nm) from right below the one or more than one edge, or areas within a predetermined distance (for example: 100 nm) from right below the one pair of two facing edges. In addition to or instead of this rule, it may be another rule for specifying the arrangement position of the MIM capacitors 20 with a predetermined percentage (or lower) of the occupancy of the lower layer wirings 11 in the area, although the lower layer wirings 11 may be positioned in the area right below the one or more than one edge of the plane of the upper electrode 23 of the MIM capacitors 20, the areas right below the one pair of two facing edges, the area within a predetermined distance (for example: 100 nm) from right below the one or more than one edge, or the areas within a predetermined distance (for example: 100 nm) from right below the one pair of two facing edges.

The lower layer wiring arrangement forbidden area information acquisition unit 2 and the lower layer wiring arrangement forbidden area information retention unit 3 have the same structures as the above, and thus will not be described again.

The compensation rule retention unit 8 retains a rule for compensation of the pattern of the lower layer wirings 11 designed by the lower layer wiring designing unit 6. Specifically, the compensation rule retention unit 8 retains a rule defining the minimum spacing, shape and size of the lower layer wirings 11. The compensation rule retention unit 8 is preferably configured with a non-volatile memory.

The compensation unit 9 compensates for the pattern of the lower layer wirings 11 designed by the lower layer wiring designing unit 6, using the lower layer wiring arrangement forbidden area information and the compensation rule, if the lower layer wirings 11 are to be positioned in the area(s) right below the edge(s) or in the area(s) within a predetermined distance from right below the edge(s) depending on the arrangement position of the MIM capacitors 20 determined by the lower layer wiring consideration MIM arrangement position determination unit 7. Specifically, the compensation unit 9 compensates for the pattern of the lower layer wirings 11 so that the lower layer wirings 11 are not positioned in the area (s) specified with the lower layer wiring arrangement forbidden area information in conformity with the minimum spacing, form and size of the lower layer wirings 11 ruled in the compensation rule.

The output unit 5 is configured to output the pattern of the lower layer wirings 11 compensated by the compensation unit 9. The output unit 5 has the same structure as that described above, and thus will not be described again.

Descriptions will now be made to a method of designing lower layer wirings, using the above-described lower layer wiring designing device.

The method of designing lower layer wirings according to the other example of this embodiment includes a first step S11, a second step S12 and a third step S13.

In the first step S11, the pattern of the lower layer wirings 11 is designed. In this step, the pattern of the lower layer wirings 11 is designed without being subject to the arrangement position of the MIM capacitors 20. This step may be realized by using a conventional wiring designing tool.

The second step S12 is to determine the arrangement position of the MIM capacitors 20 based on the pattern designed in the first step S11. This step may be, for example, to display the pattern of the lower layer wirings 11 which has been designed in the first step S11 on the display attached to the lower layer wiring designing device, and to receive a determination input regarding the determined position of the MIM capacitors 20 from the user using an operational device (for example: arrow keys, a mouse, a keyboard, a touchscreen, and the like) attached to the lower layer wiring designing device. This step may be to specify a candidate(s) position for arranging the MIM capacitors 20 in accordance with a preset rule based on the pattern designed in the first step S11, and then to receive an input regarding one or more than one selection from the candidate (s).

In the third step S13, the pattern of the lower layer wirings 11 which has been designed in the first step S11 is compensated in accordance with a preset compensation rule (the minimum spacing, form and size of the lower layer wirings 11) so that the lower layer wirings 11 do not exist in the area right below the one or more than one edge of the upper electrode 23 of the MIM capacitors 20, the areas right below the one pair of two facing edges, the area within a predetermined distance (for example: 100 nm) from right below the one or more than one edge, or the areas within a predetermined distance (for example: 100 nm) from right below the one pair of two facing edges. The compensation in this step may automatically be performed, or may be performed upon reception of a user input. If the compensation is performed upon reception of the input for compensation from the user, it is judged whether the received compensation contents satisfy a preset compensation rule. If it is judged that the compensation contents do not satisfy the compensation rule, information of the fact is output through the display or a speaker.

The above-described method of designing the lower layer wirings may be realized by a program for executing the first step, the second step and the third step on a computer. The first step is to design the pattern of the lower layer wirings. The second step is to determine the arrangement position of the MIM capacitors based on the pattern designed in the first step. The third step is to compensate for the pattern in accordance with the preset compensation rule so that the lower layer wirings do not exist in the area right below the one or more than one edge of the plane of the upper electrode of the MIM capacitor, the areas right below the one pair of two facing edges, the area within a predetermined distance from right below the one or more than one edge, or the areas within a predetermined distance from right below the one pair of two facing edges. The above-described program may be a program that continuously executes all of the above-described steps, or a program that is realized in combination with a plurality of programs corresponding to a plurality of process units into which the above-described steps have been divided.

The lower layer wiring designing device, method of designing lower layer wirings and program described above are effective for a circuit in which improved electrical properties are expected if the MIM capacitors 20 are implemented thereon, though the MIM capacitors are not necessarily mounted.

It is apparent that the present invention is not limited to the above embodiment, and may be modified and changed without departing from the scope and spirit of the invention.

What is claimed is:

1. A semiconductor device comprising:
    a lower layer wiring layer which includes a plurality of lower layer wirings;
    an MIM (Metal Insulator Metal) capacitor which is formed above one of said lower layer wirings and formed above said lower layer wiring layer and includes a lower electrode, a capacity dielectric film and an upper electrode having a planar form smaller than that of said lower electrode which are layered from underneath such that the lower electrode is below the capacity dielectric film and the capacity dielectric film is below the upper electrode; and
    an upper layer wiring layer which is formed above said MIM capacitor and includes a plurality of upper layer wirings connected to said lower electrode and said upper electrode respectively through a via plug, and wherein
    a plane of said upper electrode is made rectangular, and
    said lower layer wirings are not arranged substantially right below one or more than one edge of said plane of said upper electrode.

2. The semiconductor device according to claim 1, wherein said lower layer wirings are not arranged right below one pair of two facing edges of said plane of said upper electrode.

3. The semiconductor device according to claim 1, wherein said lower layer wirings are not arranged within a distance 100 nm from right below said one or more than one edge of said plane of said upper electrode or one pair of two facing edges of said plane of said upper electrode.

4. The semiconductor device according to claim 1, wherein said lower layer wirings not arranged right below said upper electrode form a pattern in which said plurality of linear lower layer wirings are aligned at equal intervals.

5. The semiconductor device according to claim 1, wherein said via plug connecting said upper layer wirings and said lower electrode is arranged near the edge of said upper electrode, right below which said lower layer wirings are not arranged.

6. The semiconductor device according to claim 1, wherein said lower layer wirings are not arranged right below said via plug connecting said upper layer wirings and said upper electrode.

7. The semiconductor device according to claim 1, wherein a distance between a contact point of the upper electrode and the via plug, and a defect generation position of the capacity dielectric film is maximized.

8. The semiconductor device according to claim 1, wherein a distance between a contact point of the lower electrode and the via plug, and a defect generation position of the capacity dielectric film is maximized.

9. The semiconductor device according to claim 1, further comprising a wiring cap film located above said lower layer wiring layer.

10. The semiconductor device according to claim 1, further comprising an interlayer insulating film located below said lower electrode.

11. The semiconductor device according to claim 1, further comprising a hard mask insulating film located above said upper electrode.

12. The semiconductor device according to claim 1, wherein the capacity dielectric film comprises a high dielectric film with a Perovskite structure.

13. The semiconductor device according to claim 1, wherein at least one of said plurality of lower layer wirings not arranged substantially right below one or more than one edge of said plane of said upper electrode is located underneath said upper electrode.

* * * * *